United States Patent

Worcester

[15] 3,676,781

[45] July 11, 1972

[54] AUDIO FREQUENCY INDICATOR FOR SCAN TUNED RADIO RECEIVER

[72] Inventor: Joseph A. Worcester, Frankfort, N.Y.

[73] Assignee: General Electric Company

[22] Filed: Dec. 29, 1970

[21] Appl. No.: 102,404

[52] U.S. Cl. ..............................325/455, 325/337, 325/418, 325/424, 325/457, 325/469, 329/111, 331/64, 334/86

[51] Int. Cl. ..........................................................H04b 1/36

[58] Field of Search..................325/455, 469, 337, 341, 417, 325/418, 424, 457, 468; 334/30, 86; 340/214; 329/111; 331/64; 332/20, 39

[56] References Cited

UNITED STATES PATENTS 2,316,899 4/1943 Stolzenberg..............................334/30

*Primary Examiner*—Albert J. Mayer
*Attorney*—Marvin A. Goldenberg, W. J. Shanley, Jr., Frank L. Neuhauser, Oscar B. Waddell and Joseph B. Forman

[57] ABSTRACT

An audible frequency indicator for use in a radio receiver employing automatic frequency scan tuning. A variable scan control signal, corresponding to the frequency location of the scan within a given frequency band is applied to a voltage controlled oscillator. The voltage controlled oscillator produces an output in the audible range, whose pitch is a function of the frequency location of the scan, and that is terminated when a station is tuned in.

5 Claims, 1 Drawing Figure

PATENTED JUL 11 1972 3,676,781
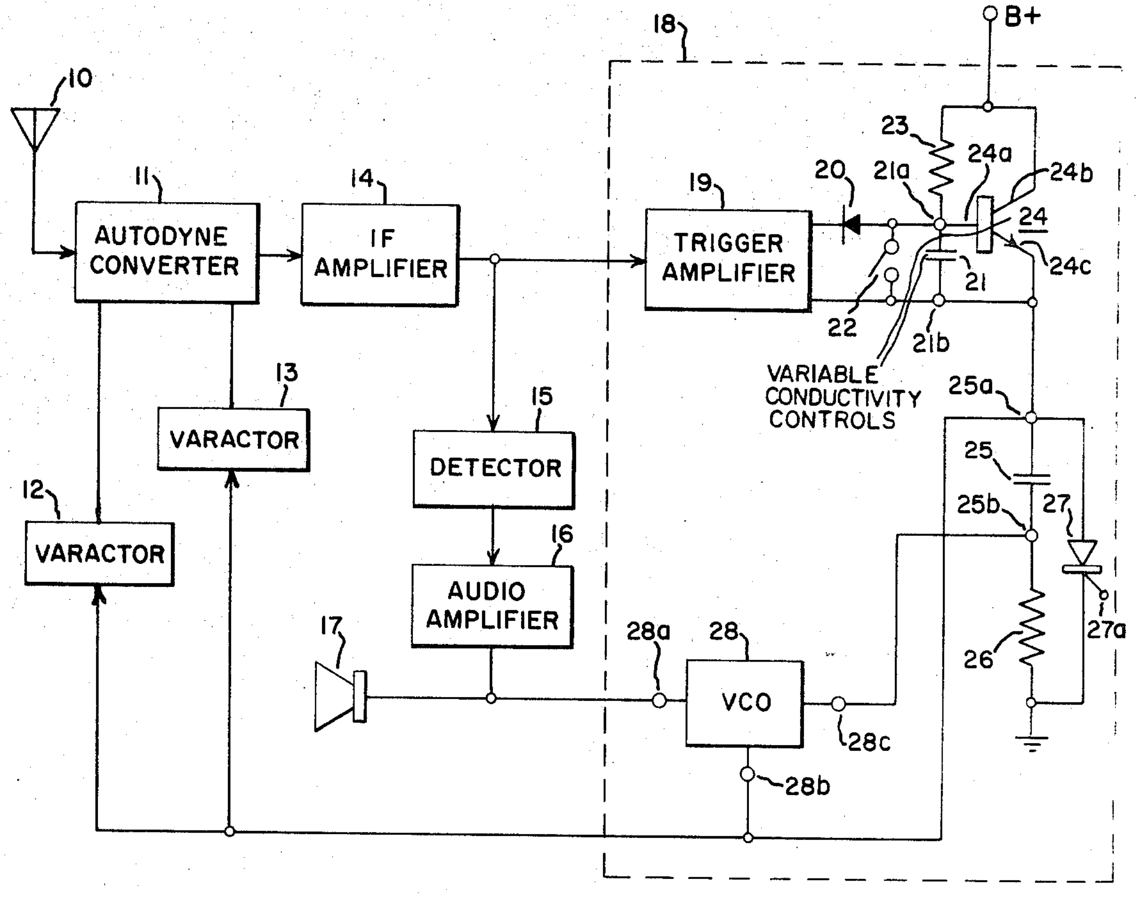
INVENTOR:
JOSEPH A. WORCESTER,
BY [signature]
HIS ATTORNEY.

AUDIO FREQUENCY INDICATOR FOR SCAN TUNED RADIO RECEIVER

BACKGROUND OF THE INVENTION

This invention relates to frequency indicators for use in radio receivers and, more particularly, to frequency indicators for use in a radio receiver having an automatic frequency scan tuning system.

Radio receivers customarily employ means to indicate the frequency location within a given frequency band at which the radio receiver is tuned. In most cases the frequency indicator consists of a reference member that is displaceable across a calibrated scale. By noting the position of the member the operator learns the frequency location of a particular station and also obtains a directional difference which would assist him when he may not know or recall the exact frequency of a desired station but may know its position on the dial relative to some known station or to one end of the scale.

The most common type of frequency indicators have a reference member mechanically linked to a tuning drive means; however in some applications electronic frequency indication is also used. This non-mechanical approach is usually found in radio receivers employing electronic tuning rather than mechanical tuning. Mechanical tuning systems usually employ variable tuning capacitors that are mechanically linked to the frequency indicator, usually by a gear or pulley-cable arrangement. The electronic tuning systems, on the other hand, use semiconductor elements called varactors, whose capacitance varies in accordance with a variable tuning bias voltage. Electronic tuning methods are often employed in radios having automatic scan tuning systems. In such scan tuning systems the varactors are driven through their range of capacitance values by a variable scan control signal supplied by appropriate scan control circuitry. The variable scan control signal at any given instant determines the exact frequency location of the receiver and a voltmeter, calibrated to read in KHz translates the level of the control signal into suitable visual frequency indication.

When such automatic scan tuning systems are incorporated in radio receivers having conventional mechanical tuning systems, problems arise with respect to frequency indication. Because of the different operational modes of the two tuning systems, if it were desired to use one indicator such as a mechanically actuated sliding scale, it would be necessary to convert the electronic information of the automatic scan tuning system to a mechanical signal to drive the scale indicator. On the other hand, if it were desired to use the voltmeter to provide frequency indication for the mechanical tuning system, means must be provided to convert the mechanical information signal to a voltage level to drive the voltmeter.

The above-mentioned difficulties could, of course, be obviated by using a conventional frequency indicator when the receiver is tuned mechanically and a voltmeter indicator when tuned by the automatic frequency scan system. This approach proves to be too expensive and the presence of two frequency scales has a deleterious effect on the aesthetic qualities of the receiver face.

SUMMARY OF THE INVENTION

This invention overcomes these disadvantages of prior art systems by providing an audible tone to indicate the frequency location of the scan in response to the level of the scan control signal. When the operator desires to use the receiver in an automatic scan mode, the exact location of the frequency scan within the given frequency band is not so important since the scan feature is often used in geographic areas unfamiliar to the operator or when it is desired to scan a series of stations at random until one having a desired type of programming is encountered. Knowledge of the general location of the scan however is important. An audible signal having a characteristic such as volume or pitch that changes in response to changes in the scan location and is removed when a station is tuned in provides such knowledge. For example, when the pitch is low, the operator would know that the scan is at the lower end of the frequency band and vice versa. Furthermore, when the operator becomes familiar with the frequency range of the audible tone, he can know with a fair degree of accuracy the exact location of a tuned station.

It is therefore an object of this invention to provide for use in a radio receiver having an automatic frequency scan tuning system an improved circuit for providing an audible indication of the frequency location of the scan within a given frequency band.

It is another object of this invention to provide for use in a radio receiver having an automatic frequency scan tuning system an improved circuit to vary the pitch of an audible signal to indicate the frequency location of the scan within a given frequency band.

Briefly stated, the above objects, in one embodiment of this invention, are obtained by employing an audible signal generating means such as a voltage controlled oscillator (VCO) having a signal input and a disabling input. The signal input is connected to a scan capacitor within the automatic frequency scan tuning system, while the disabling input is coupled to a disabling means, responsive to a cessation of current through the scan capacitor, to terminate the operation of the generating means. The output of the VCO varies approximately from 400 Hz to 2,500 Hz in the audible frequency range and is connected to the speaker system of the radio. A variable conductivity control means such as a transistor determines the charge at a given instant on the scan capacitor. The scan capacitor as it charges provides a variable scan control signal to variable reactance tuning means within the tuning circuitry causing the tuning circuitry to scan through a given frequency band. In addition to supplying a variable scan control to the variable reactance tuning means, the same signal bearing frequency location information is applied to the voltage controlled oscillator as discussed above so that an audible frequency indication is obtained. When a station is tuned in, the disabling means provides a disabling signal to the VCO to terminate its operation.

BRIEF DESCRIPTION OF THE DRAWING

While the specification concludes with claims particularly pointing out and distinctly claiming a subject matter which is regarded as the invention, it is believed that the invention could be better understood from the following description taken in connection with the accompanying FIGURE of the drawing which is a schematic circuit diagram of a radio receiver employing, in accordance with the invention, audible frequency indication circuitry operatively coupled to an automatic frequency scan system.

DESCRIPTION OF THE PREFERRED EMBODIMENT

Referring to the FIGURE of the drawing, an incoming radio signal is received by an antenna 10 and coupled to a converter 11, commonly of the autodyne type. The autodyne converter 11, in conventional manner, comprises a radio frequency tuning circuit and a mixing circuit where the radio frequency signal is beat against oscillations from an integrally constructed local oscillator to form an intermediate frequency signal. The radio frequency circuit may be tuned by a varactor 12 and the local oscillator by a varactor 13 in a well known manner. The output of the autodyne converter 11 is coupled to an intermediate frequency amplifier 14 and then to a detector 15 where the information signal is separated from the carrier wave. The information signal is then amplified by audio amplifier 16 and passed along to speaker 17.

The scan and frequency indicator circuitry is shown within broken lines and labeled 18, the invention being contained within this circuitry.

Assuming that a scan has been previously initiated and that the tuning circuits are being driven through a given frequency band, a narrow band trigger amplifier 19, that provides an output signal when a voltage at its input received from the IF amplifier 14 is above a certain threshold level, determines when the scan has encountered a station. Trigger amplifier 19 has two floating outputs, one of which is connected through a diode 20 to one terminal 21*a* of capacitor 21 and the other attached to the other terminal 21*b* of capacitor 21. Capacitor 21 is connected in parallel with a shorting switch 22 which may be employed to initiate scanning. The diode 20 prevents capacitor 21 from discharging through the trigger amplifier 19. Capacitor 21 is coupled through a biasing resistor 23 to a source of biasing voltage $B^+$.

In order to determine the level of the variable scan control signal, control transistor 24, having base 24*a*, collector 24*b* and emitter 24*c* electrodes has its base electrode 24*a* connected to terminal 21*a* of capacitor 21 so that the state of conductivity of the control transistor 24 is determined by the charge on capacitor 21. The collector 24*b* of control transistor 24 is connected to the source of positive biasing voltage $B^+$and the emitter 24*c* of control transistor 24 is coupled to terminal 21*b* of capacitor 21 and to terminal 25*a* of scan capacitor 25 for controlling the charging current to the capacitor thereby determining the voltage level thereon. The scan capacitor 25 is connected from terminal 25a to the tuning varactors 12 and 13 to determine their bias voltages. A resistor 26, which acts as a disabling means, connects the other terminal 25b of scan capacitor 25 to a common reference potential.

A silicon controlled rectifier (SCR) 27, to effect the discharge of scan capacitor 25, is connected across the scan capacitor 25-resistor 26 serial combination. The SCR 27 is gated by a signal applied to its gate terminal 27*a*, the signal being generated when the scan system has reached one extreme of its range. Circuitry for generating the gating signal is not shown in the FIGURE, since it can be provided in a number of well-known ways. For example, the gating signal may be derived from the voltage across the capacitor 25 connected through a voltage divider circuit. Upon the voltage reaching a given value corresponding to one extreme end of the scanning range, SCR 27 is triggered into conduction so as to discharge the capacitor, whereupon the SCR is turned off and the capacitor again permitted to charge.

To provide an audible indication of the location of the frequency scan, a voltage controlled oscillator (VCO) 28 whose output frequency is a function of its input voltage, has its output 28*a* connected to speaker 17. The signal input 28*b* of the VCO 28 is connected to terminal 25*a* of scan capacitor 25 so that the voltage level being supplied to the varactors 12 and 13 is also supplied to the VCO 28. The VCO 28 may be a conventional transistor oscillator circuit also having a varactor diode as the tuning element, the scan voltage being applied there across. When a station is located, a constant bias is applied to the scan capacitor 25, causing current to stop flowing through the scan capacitor 25 and the resistor 26. The resistor 26 provides a disabling Signal to the disabling input 28*c* of the VCO 28, causing the VCO to terminate its operation. By way of example, the voltage across resistor 26 may be applied as a positive bias voltage to the VCO transistor for causing the transistor to conduct, the transistor ceasing conduction upon this voltage going to zero.

OPERATION

When the bias voltage $B^+$is connected to the scan circuitry, capacitor 21 begins to charge through the biasing resistor 23 thereby increasing the conductivity of the control transistor 24. Current begins to flow through the collector 24*b* and emitter 24*c* of the control transistor 24 to charge the scan capacitor 25. The scan control signal, developed at terminal 25*a* of the scan capacitor 25 is supplied to the signal input 28*b* of the voltage controlled oscillator 28 and the varactors 12 and 13. The VCO 28 provides an audible signal to the speaker 17 that is indicative of the magnitude of the voltage developed across scan capacitor 25 at a given instant. As this voltage gradually increases, the varactors 12 and 13 drive the tuning circuitry within the autodyne converter 11 through a given frequency band. The increasing voltage causes the VCO to generate an audible signal that may start low in pitch and increase as the scan continues. From the pitch the operator can determine the general location of the scan at a given instant.

As a station is approached, the threshold level of the trigger amplifier 19 is exceeded and the trigger amplifier provides an output in response to a narrow band portion of the received signal above the trigger amplifier threshold. The output from the trigger amplifier 19 is applied to the base 24*a* of the control transistor 24. This output acts as a maintenance signal and insures that the scan capacitor 25 will have an approximately constant voltage across it, thus locking in the received station. Essentially no current will flow through the scan capacitor 25, causing the bias voltage across resistor 26 that is applied to disabling input 28*c* to be at approximately zero level. Therefore, the audible frequency indicator stops as a station is tuned in.

While a specific embodiment of this invention has been shown and described, other embodiments may be made without departing from the spirit and scope thereof. The range of audible tones may be other than the indicated 400 Hz to 2,500 Hz. Further, the invention is not intended to be limited to changes in frequency of the audible signal with respect to changes in the frequency location of the scan as the only means of indicating the frequency location. Changes in volume could also be used as a frequency indicator with minor changes in the VCO circuitry as described.

What is new and novel and desired to be secured by Letters Patent of the United States is:

1. In a radio receiver including an automatic frequency scan system and tuning circuitry coupled to said scan system and responsive to a variable scan control signal of said system for scanning through a frequency band;

a. generating means for generating an audible signal having a variable characteristic, b. means for coupling said scan system to said generating means for varying said characteristic in response to variations in said scan control signal, said audible signal thereby being indicative of the location of the scan within the frequency band, c. said scan system including means for providing a disabling signal in response to a cessation in variation of said scan control signal, and d. means for supplying said disabling signal to said generating means when a station is tuned in so as to terminate said audible signal.

2. A radio receiver as recited in claim 1 wherein said generating means comprises an oscillator whose output frequency is varied in response to variations in said variable scan control signal.

3. In a radio receiver including an automatic frequency scan system and tuning circuitry coupled to said scan system and responsive to a variable scan control signal of said system for scanning through a frequency band;

a. said scan system including a scan capacitor whose voltage provides said variable scan control signal and means for varying the voltage across said scan capacitor for effecting scan through the frequency band, b. an oscillator for generating an audible signal whose frequency can be varied, and c. means for coupling said scan capacitor to said oscillator for applying a voltage obtained from said capacitor to an input of said oscillator to cause variation in the frequency of said oscillator in response to variation in the voltage across said capacitor, whereby an audible signal is produced having a pitch varying with the voltage across said capacitor to indicate the location of said scan within the frequency band.

4. In a radio receiver as recited in claim 3 and furthermore including means coupled to said scan capacitor and responsive to a cessation of current through said scan capacitor for applying a disabling signal to said generating means when a station is tuned in so as to terminate said audible signal.

5. In a radio receiver having tuning circuitry including variable reactance tuning means;

a. automatic frequency scan circuitry coupled to said tuning circuitry to provide a variable scan control signal to said tuning circuitry for scanning through a frequency band, said scan circuitry comprising:

i. a scan capacitor coupled to said variable reactance tuning means for supplying said variable scan control signal, ii. variable conductivity control means coupled to said scan capacitor for controlling the charge on said scan capacitor, and iii. threshold means coupled to said control means and coupled to and responsive to an output from said tuning circuitry for determining the conductivity of said variable conductivity control means, b. disabling means coupled to said scan capacitor for providing a disabling signal in response to the cessation of current through said scan capacitor; and c. audible signal generating means, having a signal input and a disabling input;

i. said signal input coupled to said scan capacitor whereby said audible signal generating means is responsive to said scan control signal for generating an audible signal whose frequency varies with said scan control signal, and ii. said disabling input coupled to said disabling means to terminate said audible signal in response to the disabling signal.

* * * * *